(12) United States Patent
Kim et al.

(10) Patent No.: US 9,419,172 B2
(45) Date of Patent: Aug. 16, 2016

(54) METHOD OF MANUFACTURING LIGHT EMITTING DEVICE PACKAGE

(71) Applicant: SAMSUNG ELECTRONICS CO., LTD., Suwon-si, Gyeonggi-do (KR)

(72) Inventors: Min Ki Kim, Seoul (KR); Jung Jin Kim, Hwaseong-si (KR); Yong Min Kwon, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/606,954

(22) Filed: Jan. 27, 2015

(65) Prior Publication Data
US 2015/0357250 A1 Dec. 10, 2015

(30) Foreign Application Priority Data
Jun. 10, 2014 (KR) .......................... 10-2014-0070036

(51) Int. Cl.
| | |
|---|---|
| *H01L 21/66* | (2006.01) |
| *H01L 33/00* | (2010.01) |
| *H01L 23/00* | (2006.01) |
| *G01R 31/26* | (2014.01) |

(52) U.S. Cl.
CPC .......... *H01L 33/005* (2013.01); *G01R 31/2635* (2013.01); *H01L 24/97* (2013.01); *H01L 2224/14* (2013.01); *H01L 2224/16225* (2013.01); *H01L 2933/0041* (2013.01)

(58) Field of Classification Search
CPC .................................................. H01L 33/0095
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |

(Continued)

FOREIGN PATENT DOCUMENTS

| | | |
|---|---|---|
| EP | 2 610 058 A1 | 7/2013 |
| JP | 5107886 B2 | 12/2012 |

(Continued)

*Primary Examiner* — Fernando L Toledo
*Assistant Examiner* — Valerie N Newton
(74) *Attorney, Agent, or Firm* — Lee & Morse, P.C.

(57) ABSTRACT

A method of manufacturing a light emitting device package includes forming a plurality of light emitting devices by growing a plurality of semiconductor layers on a wafer, and measuring color characteristics of light emitted from each of the plurality of light emitting devices. For each of the plurality of light emitting devices, a type and an amount of wavelength conversion material is determined for color compensating the light emitting device based on a difference between the measured color characteristics and target color characteristics. A wavelength conversion layer is formed on at least two light emitting devices among the plurality of light emitting devices, the wavelength conversion layer having the type and the amount of wavelength conversion material determined for the at least two light emitting devices. The plurality of light emitting devices is then divided into individual light emitting device packages.

17 Claims, 17 Drawing Sheets

(56) References Cited

U.S. PATENT DOCUMENTS

| | | |
|---|---|---|
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,675,075 B2 | 3/2010 | Nagai |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,048,695 B2 | 11/2011 | West |
| 8,049,161 B2 | 11/2011 | Sherrer et al. |
| 8,115,375 B1 * | 2/2012 | Zhai ............... F21V 29/004 313/46 |
| 8,129,711 B2 | 3/2012 | Kang et al. |
| 8,179,938 B2 | 5/2012 | Kim |
| 8,232,117 B2 | 7/2012 | Basin et al. |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,450,147 B2 | 5/2013 | Chandra |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2007/0222365 A1 | 9/2007 | Tamamura |
| 2010/0295077 A1 | 11/2010 | Melman |
| 2011/0316031 A1 | 12/2011 | Ooyabu et al. |
| 2012/0228646 A1 | 9/2012 | Kuo et al. |
| 2012/0261700 A1 | 10/2012 | Ooyabu et al. |
| 2012/0319575 A1 | 12/2012 | Nakamura et al. |
| 2013/0049021 A1 * | 2/2013 | Ibbetson ............ H01L 33/0095 257/88 |
| 2013/0062640 A1 | 3/2013 | Yen et al. |
| 2013/0178003 A1 | 7/2013 | Chen et al. |
| 2013/0228804 A1 | 9/2013 | Yan |
| 2013/0234186 A1 | 9/2013 | Katayama |
| 2013/0234187 A1 | 9/2013 | Ebe et al. |
| 2013/0248893 A1 | 9/2013 | Sugizaki |

FOREIGN PATENT DOCUMENTS

| | | |
|---|---|---|
| JP | 5110229 B1 | 12/2012 |
| JP | 5292368 B2 | 9/2013 |
| KR | 10-2012-0031732 A | 4/2012 |
| KR | 10-2013-0083208 A | 7/2013 |

* cited by examiner

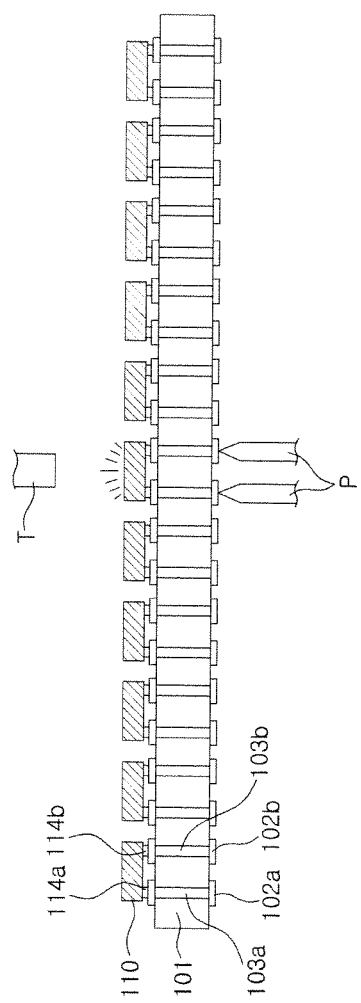

METHOD OF MANUFACTURING LIGHT EMITTING DEVICE PACKAGE

CROSS-REFERENCE TO RELATED APPLICATION

This application claims the benefit of Korean Patent Application No. 10-2014-0070036 filed on Jun. 10, 2014, with the Korean Intellectual Property Office, the disclosure of which is incorporated herein by reference.

TECHNICAL FIELD

The present disclosure relates to a method of manufacturing a light emitting device package.

BACKGROUND

A light emitting diode (LED) is a device including a material that emits light through the application of electrical energy thereto, in which energy generated by electron-hole recombination in semiconductor junction parts is converted into light to be emitted therefrom. LEDs are commonly employed as light sources in general lighting devices, display devices, and the like, and the development of LEDs has thus been accelerated.

In particular, recently, the development and employment of light emitting diodes (LEDs) (e.g., gallium nitride-based LEDs) has increased, and mobile device keypads, vehicle turn signal lamps, camera flashes, and the like, using such LEDs, have been commercialized, and in line with this, the development of general lighting devices using LEDs has been accelerated. Products in which LEDs are used, such as backlight units of large TVs, vehicle headlamps, general lighting devices, and the like, are gradually moving toward large-sized products having high outputs and high efficiency, and a range of LED use is further being expanded.

Accordingly, there is a need for a method of reducing manufacturing costs and shortening manufacturing time for mass production of LED packages.

SUMMARY

An exemplary embodiment in the present disclosure may provide a method of reducing manufacturing costs and shortening manufacturing time for mass production of LED packages.

According to an exemplary embodiment in the present disclosure, a method of manufacturing a light emitting device package may include forming a plurality of light emitting devices by growing a plurality of semiconductor layers on a wafer, and measuring color characteristics of light emitted from each of the plurality of light emitting devices. A type and an amount of wavelength conversion material for color compensating each of the plurality of light emitting devices is determined based on a difference between the measured color characteristics and target color characteristics. A wavelength conversion layer is formed on at least two light emitting devices among the plurality of light emitting devices to have the type and the amount of wavelength conversion material determined for the at least two light emitting devices. The plurality of light emitting devices is then divided into individual light emitting device packages.

The forming of the wavelength conversion layer may further include preparing a wavelength conversion film having the type and the amount of the wavelength conversion material determined for the at least two light emitting devices, cutting the wavelength conversion film to have an area sufficient to cover the at least two light emitting devices, and disposing the cut wavelength conversion film on the at least two light emitting devices.

The wavelength conversion film may be divided into a plurality of regions.

Areas of the plurality of regions may correspond to areas of the individual light emitting devices.

Perforations may be formed in the wavelength conversion film between the plurality of regions.

The perforations may be slits.

The method may further include cutting the plurality of light emitting devices into individual light emitting devices and mounting the plurality of light emitting devices on a package substrate, prior to forming the wavelength conversion layer. The dividing into the individual light emitting device packages may include dicing the package substrate.

The method may further include forming a light transmissive encapsulating part on the plurality of light emitting devices on which the wavelength conversion layer has been formed, prior to dividing the plurality of light emitting devices into the individual light emitting device packages.

The forming of the wavelength conversion layer may include disposing on at least two light emitting devices a wavelength conversion film having the type and the amount of the wavelength conversion material determined for the at least two light emitting devices, where perforations are formed in the wavelength conversion film. The forming of the encapsulating part may include injecting an insulating material for the encapsulating part into the perforations.

The wavelength conversion film may be formed of a semi-cured material containing a phosphor.

The measured color characteristics of light emitted from each of the plurality of light emitting devices may include at least one of wavelength, power, full width at half maximum (FWHM), and color coordinates of light emitted from each of the plurality of light emitting devices.

The wavelength conversion film may have a structure in which a plurality of layers is stacked.

Different layers of the plurality of layers in the wavelength conversion film may include different phosphors.

According to an exemplary embodiment in the present disclosure, a method of manufacturing a light emitting device package may include forming a plurality of light emitting devices by growing a plurality of semiconductor layers on a wafer, and measuring color characteristics of light emitted from each of the plurality of light emitting devices. A wavelength conversion layer having a uniform thickness is formed to cover all of the plurality of light emitting devices. A type and an amount of a wavelength conversion material for color compensating each of the light emitting devices is determined based on a difference between the measured color characteristics and target color characteristics. An additional wavelength conversion layer is selectively formed on the wavelength conversion layer in a position corresponding to at least some of the plurality of light emitting devices to have the type and the amount of wavelength conversion material determined for the at least some of the plurality of light emitting devices. The plurality of light emitting devices is then divided into individual light emitting device packages.

The selective forming of the additional wavelength conversion layer may include applying the additional wavelength conversion layer to at least two of the plurality of light emitting devices having the type and the amount of wavelength conversion material determined.

According to a further exemplary embodiment in the present disclosure, a method may include measuring, for each of a plurality of light emitting devices mounted on a substrate, color characteristics of light emitted from the light emitting device. A group of adjacent light emitting devices having similar measured color characteristics is identified among the plurality of light emitting devices. For the group of adjacent light emitting devices, a type and an amount of wavelength conversion material for color compensating the light emitting devices is determined based on a difference between the measured color characteristics and target color characteristics. A wavelength conversion film having the type and the amount of wavelength conversion material determined for the group of light emitting devices is disposed across the group of adjacent light emitting devices.

The wavelength conversion film may span across regions of the substrate between the adjacent light emitting devices, and the wavelength conversion film may include perforations formed in the wavelength conversion film in the regions spanning between the adjacent light emitting devices.

The method may further include forming a light transmissive encapsulating part on the plurality of light emitting devices, where the forming of the light transmissive encapsulating part includes injecting an insulating material for the encapsulating part into the perforations.

The identifying may include identifying a first region of the substrate having a first group of adjacent light emitting devices disposed thereon having similar first measured color characteristics, and a second region of the substrate having a second group of adjacent light emitting devices disposed thereon having similar second measured color characteristics different from the first measured color characteristics. The determining may include determining first and second types and first and second amounts of wavelength conversion material for color compensating the light emitting devices of the first and second groups, respectively, based on differences between the measured color characteristics and target color characteristics. The disposing may include disposing, across the first region of the substrate having the first group of adjacent light emitting devices disposed thereon, a first wavelength conversion film having the first type and the first amount of wavelength conversion material determined for the first group of light emitting devices, and disposing, across the second region of the substrate having the second group of adjacent light emitting devices disposed thereon, a second wavelength conversion film having the second type and the second amount of wavelength conversion material determined for the second group of light emitting devices.

The method may further include forming a light transmissive encapsulating part on the plurality of light emitting devices and in regions between the light emitting devices of the first and second groups.

BRIEF DESCRIPTION OF DRAWINGS

The above and other aspects, features and advantages in the present disclosure will be more clearly understood from the following detailed description taken in conjunction with the accompanying drawings, in which:

FIGS. 1A-1C, 2A-2B, and 3 through 5 are schematic views illustrating processes for manufacturing light emitting device packages according to an exemplary embodiment in the present disclosure;

DETAILED DESCRIPTION

Figure 1A:
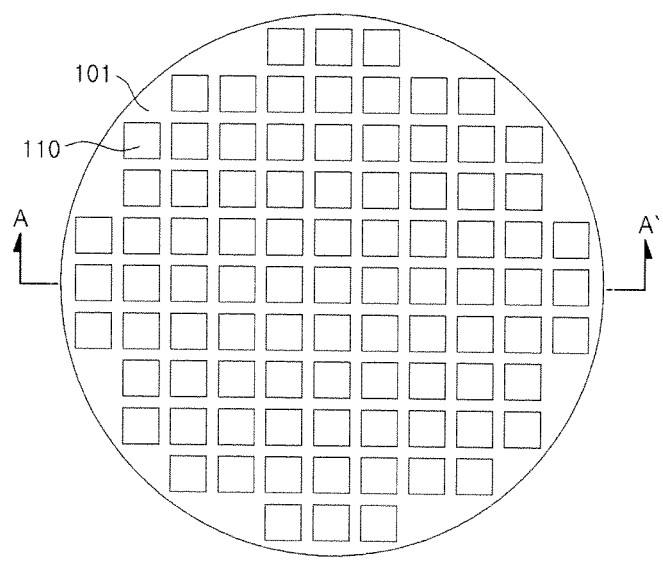

Exemplary embodiments in the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

FIGS. 1A-1C, 2A, 2B, and 3 through 5 are schematic views illustrating processes for manufacturing light emitting device packages according to an exemplary embodiment in the present disclosure.

First, a plurality of light emitting devices 110 may be formed by growing a plurality of semiconductor layers on a wafer. The plurality of light emitting devices 110 may be disposed above a package substrate 101 at predetermined intervals, as illustrated in FIG. 1A.

Figure 1B:
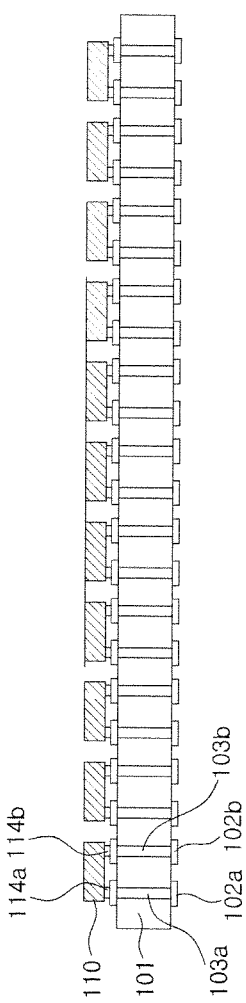
Figure 1C:
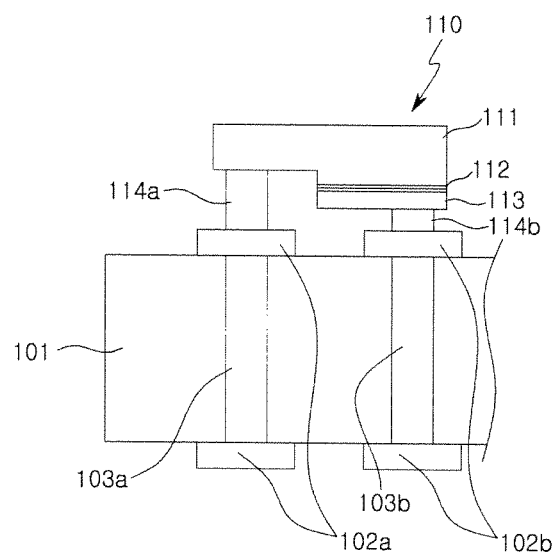

FIG. 1B is a side cross-sectional view taken along line A-A of FIG. 1A, and FIG. 1C is an enlarged view of one light emitting device 110 of FIG. 1B.

As illustrated in FIGS. 1B and 1C, first and second bonding pads 102a and 102b may be formed on one or two opposing surfaces of the package substrate 101, and the light emitting devices 110 may be mounted on the first and second bonding pads 102a and 102b. First and second electrodes 114a and 114b of the light emitting devices 110 may be electrically connected to the first and second bonding pads 102a and 102b using a conductive adhesive such as solder bumps or the like.

Specifically, the light emitting devices 110 may be mounted above one surface of the package substrate 101, and first and second through electrodes 103a and 103b may penetrate through the package substrate 101 from one surface of the package substrate 101 to the other opposing surface thereof in a thickness direction. The first and second bonding pads 102a and 102b may be disposed on one surface and the other opposing surface of the package substrate 101 to which both ends of the first and second through electrodes 103a and 103b are exposed, such that electrodes on both surfaces of the package substrate 101 may be electrically connected to each other. The package substrate 101 may be a substrate for manufacturing wafer level packages (WLPs) in which packages are completely formed on the wafer level. Both surfaces of such a substrate for WLPs may be flat, and thus the size of a package in which the light emitting device 110 is mounted may be reduced to be approximately equal to the size of the light emitting device 110.

Here, the package substrate 101 may be a plate-like substrate. Specifically, a substrate formed of Si, sapphire, ZnO, GaAs, SiC, MgAl$_2$O$_4$, MgO, LiAlO$_2$, LiGaO$_2$, GaN or the like, may be used. In an exemplary embodiment, an Si substrate may be used.

However, a material for the package substrate 101 is not limited thereto. Considering heat dissipation properties and electrical connections of light emitting device packages 100, the package substrate 101 may be formed of an organic resin material containing epoxy, triazine, silicone, polyimide, or the like, or another organic resin material. In order to improve the heat dissipation properties and light emitting efficiency, the package substrate 101 may be formed of a ceramic material having high heat resistance, superior thermal conductivity, high reflective efficiency, and the like. For example, Al$_2$O$_3$, AlN, or the like, may be used.

Besides the aforementioned substrate, a printed circuit board, a lead frame, or the like may be used for the package substrate 101 according to the present exemplary embodiment.

As illustrated in FIG. 1C, the light emitting devices 110 may be mounted above the package substrate 101, and may include a first conductivity-type semiconductor layer 111, an active layer 112, and a second conductivity-type semiconductor layer 113 sequentially stacked therein. The first and second conductivity-type semiconductor layers 111 and 113 may be n-type and p-type semiconductor layers, respectively, and may be formed of a nitride semiconductor. The present inventive concept is not limited thereto; however, according to the present exemplary embodiment, the first and second conductivity-type semiconductor layers 111 and 113 may be understood as referring to n-type and p-type semiconductor layers, respectively. The first and second conductivity-type semiconductor layers 111 and 113 may be formed of a material having a composition of Al$_x$In$_y$Ga$_{(1-x-y)}$N (where $0 \le x < 1$, $0 \le y < 1$, and $0 \le x+y < 1$). For example, GaN, AlGaN, InGaN, or the like may be used therefor.

The active layer 112 may be a layer for emitting visible light having a wavelength of approximately 350 nm to 680 nm. The active layer 112 may be formed of undoped nitride semiconductor layers having a single-quantum-well (SQW) structure or a multi-quantum-well (MQW) structure. For example, the active layer 112 may have an MQW structure in which quantum barrier layers and quantum well layers having a composition of Al$_x$In$_y$Ga$_{(1-x-y)}$N (where $0 \le x < 1$, $0 \le y < 1$, and $0 \le x+y < 1$) are alternately stacked, such that the active layer 112 may have a predetermined energy bandgap and emit light through the recombination of electrons and holes in quantum wells. In the case of the MQW structure, an InGaN/GaN structure may be used, for example. The first and second conductivity-type semiconductor layers 111 and 113 and the active layer 112 may be formed using a crystal growth process known in the art, such as metal organic chemical vapor deposition (MOCVD), molecular beam epitaxy (MBE), hydride vapor phase epitaxy (HYPE), or the like.

The light emitting device 110 may have the first and second electrodes 114a and 114b disposed in the same direction (e.g., extending from a same surface of the light emitting device 110), which is an LED chip having a flip-chip type structure. In order to reduce crystalline defects during the growth of the semiconductor layers, a buffer layer may be further included.

The first and second electrodes 114a and 114b may be provided to allow the first and second conductivity-type semiconductor layers 111 and 113 to be electrically connected to a power source, and may be connected via ohmic-contact to the first and second conductivity-type semiconductor layers 111 and 113, respectively.

The first and second electrodes 114a and 114b may each have a single layer or multilayer structure formed of a conductive material having ohmic-contact with a respective one of the first and second conductivity-type semiconductor layers 111 and 113. For example, the first and second electrodes 114a and 114b may be formed by depositing or sputtering at least one of gold (Au), silver (Ag), copper (Cu), zinc (Zn), aluminum (Al), indium (In), titanium (Ti), silicon (Si), germanium (Ge), tin (Sn), magnesium (Mg), tantalum (Ta), chromium (Cr), tungsten (W), ruthenium (Ru), rhodium (Rh), iridium (Ir), nickel (Ni), palladium (Pd), platinum (Pt), and a transparent conductive oxide (TCO). The first and second electrodes 114a and 114b may be disposed on and extend above the surface of the package substrate 101 on which the light emitting devices 110 are mounted.

Next (e.g., following the mounting of the light emitting devices 110 on the package substrate 101), the color characteristics of the plurality of light emitting devices 110 may be measured.

As illustrated in FIG. 2A, the color characteristics of the plurality of light emitting devices 110 may be measured using a method of measuring the characteristics of light emitted from the light emitting devices 110 when power is applied thereto.

In detail, the color characteristics may be measured by mounting each light emitting device 110 on a respective pair of the first and second bonding pads 102a and 102b of the package substrate 101, applying power thereto using a probe P, and measuring the emitted light using a measuring device T. The color characteristics may be at least one of wavelength, power, full width at half maximum (FWHM), and color coordinates of light emitted from each light emitting device 110. In the present exemplary embodiment, an average wavelength of light emitted from each light emitting device 110 may be measured.

However, the measuring method is not limited thereto. Various methods for measuring the color characteristics, such as a method of irradiating ultraviolet light or a laser beam onto the surfaces of the light emitting devices 110 and measuring light reflected from the surfaces, may be used.

In a case in which the color characteristics of the plurality of light emitting devices are measured by using the aforementioned method, some or all of the light emitting devices may frequently fail to exhibit uniform color characteristics. The growth of the plurality of light emitting devices may be different due to differences in temperature, supply gas flow, and the like, at different locations on a wafer during the manufacturing processes, even when the light emitting devices are manufactured on a same/single wafer. Accordingly, the light emitting devices differ in terms of a wavelength of light and/or an amount of light emitted, and the like.

However, in this case, not all the light emitting devices have different color characteristics. In general, adjacent light emitting devices have similar color characteristics according to regions based on the positions of the light emitting devices on the wafer during the manufacturing processes.

Figure 2B:
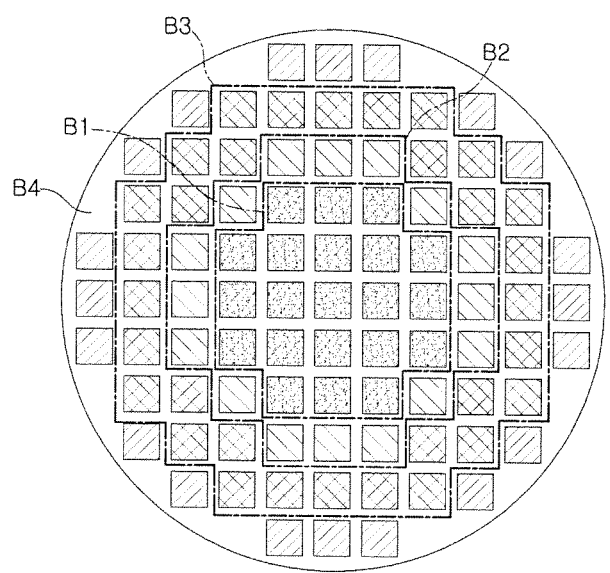

FIG. 2B illustrates an example of measurement results (i.e., color characteristic values) of the color characteristics of the plurality of light emitting devices 110 manufactured on a single wafer. As illustrated, the light emitting devices 110 having similar color characteristics among the plurality of light emitting devices 110 are grouped within each one of regions B1 to B4, and the regions B1 to B4 are distributed on the substrate 101 based on concentric circles. The plurality of light emitting devices 110 according to the present exemplary embodiment are distributed as illustrated in FIG. 2B by way of example, but are not limited thereto. Specifically, the plurality of light emitting devices 110 produced on different wafers or during different manufacturing processes may have different distributions.

In a situation in which a same wavelength conversion layer is disposed on adjacent light emitting devices having similar color characteristics, manufacturing time may be significantly reduced, as compared with situations in which different wavelength conversion layers are disposed on each adjacent light emitting device. Therefore, according to the present exemplary embodiment, manufacturing time may be reduced by disposing a same wavelength conversion layer on multiple light emitting devices having the same or similar color characteristics, including on multiple adjacent light emitting devices having the same or similar color characteristics. For example, a first wavelength conversion layer (i.e., a wavelength conversion layer having a first type and a first set of characteristics) may be disposed on all light emitting devices in region B1, while second, third, and fourth wavelength conversion layers (i.e., wavelength conversion layers respectively having second, third, and fourth types and sets of characteristics different from the first type and set of characteristics and different from each other) may respectively be disposed on light emitting devices in regions B2, B3, and B4.

Next, a type and an amount of a wavelength conversion material required for color compensation of the light emitting devices 110 may be determined based on a difference between the previously measured color characteristics and color characteristics targeted in the manufacturing process (hereinafter, referred to as "target color characteristics").

In order to determine the type and the amount of the wavelength conversion material required for the color compensation of the light emitting devices 110, it may be determined whether or not the previously measured color characteristics correspond to the target color characteristics. In a case in which the previously measured color characteristics conform to the target color characteristics, it may be determined that a wavelength conversion film in a standard amount for converting the light emitted from the light emitting devices 110 into white light is to be disposed on the light emitting devices 110.

On the other hand, in a case in which the previously measured color characteristics do not conform to the target color characteristics, an amount of wavelength conversion film may be increased or decreased, so that the light emitted from the light emitting devices 110 is converted into light having target color characteristics after passing through the wavelength conversion film.

The amount of wavelength conversion film may be determined by quantifying a rate of change of color characteristics with respect to the amount of the wavelength conversion film and calculating the amount of wavelength conversion film required based on the change rate of the color characteristics.

For example, in a case in which a wavelength of light measured is relatively short with respect to the target color characteristics, an amount of wavelength conversion film capable of increasing wavelength may be increased so as to convert the light emitted from the light emitting devices 110 into longer wavelength light. In a contrary case in which a wavelength of light measured is relatively long with respect to the target color characteristics, an amount of wavelength conversion film capable of decreasing wavelength may be relatively increased, whereby the amount of wavelength conversion film suitable for the target color characteristics may be determined.

Figure 3:
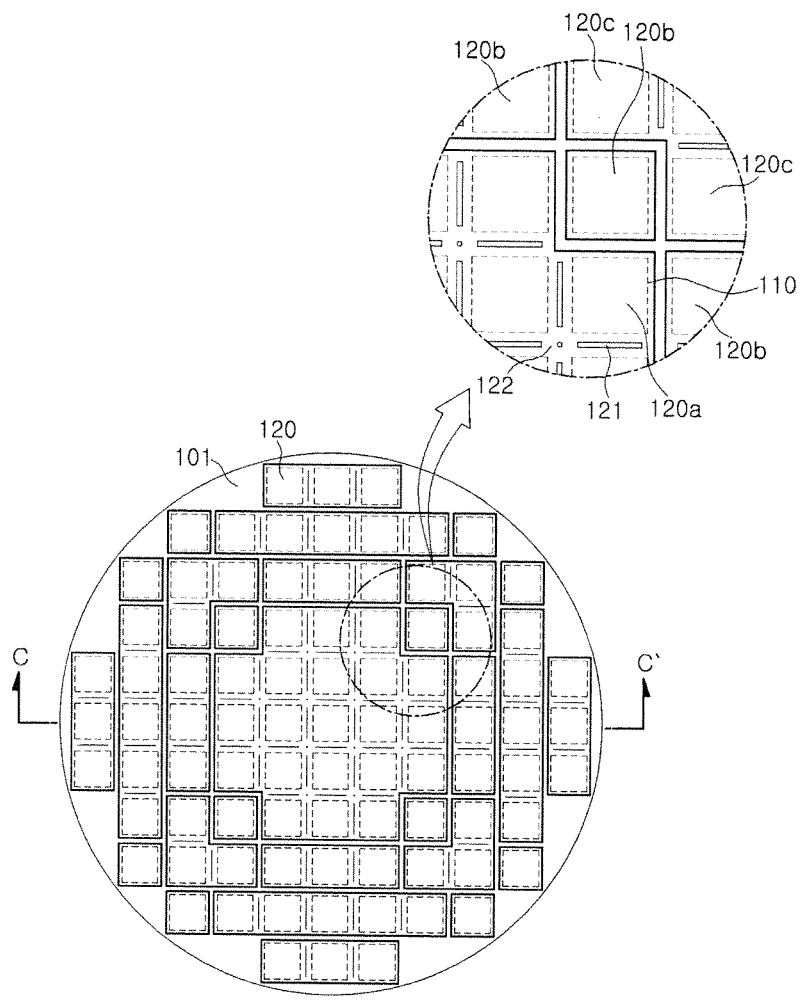

Next, as illustrated in FIG. 3, a wavelength conversion layer 120 may be formed to cover at least two light emitting devices having the same or similar color characteristic values (e.g., color characteristic values classified within a same one of regions B1 to B4) among the plurality of light emitting devices 110, on the basis of the type and the amount of the wavelength conversion material determined as described above.

The forming of the wavelength conversion layer 120 may include preparing a wavelength conversion film, cutting the wavelength conversion film to have an area for covering at least two light emitting devices having the same color characteristic values (e.g., having color characteristic values classified in a same grouping region such as one of regions B1-B4), and disposing the cut wavelength conversion film on the at least two light emitting devices having the same color characteristic values.

The preparation of the wavelength conversion film may include processing a band-like wavelength conversion sheet wound around a roll, the wavelength conversion sheet having a uniform width and a uniform thickness.

The wavelength conversion sheet may be in a partially cured state at room temperature. A semi-cured (b-stage) wavelength conversion film, changeable in shape through a pressing process or the like, may be used.

Here, the wavelength conversion sheet may be a film including at least one wavelength conversion material, such as a phosphor, a quantum dot, or the like, dispersed in semi-cured silicone.

Here, the wavelength conversion sheet may have a structure in which one or more layers are stacked, and the layers may include different phosphors or quantum dots.

Individual wavelength conversion layers 120a, 120b, 120c, and 120d may be prepared by cutting the wavelength conversion sheets according to the previously determined amount and/or region patterns. Since the wavelength conversion sheet has the form of a band having a uniform width and a uniform thickness, when a roller provided with an embossed pattern is rolled on the surface of the wavelength conversion sheet while pressure is applied thereto, such an embossed pattern may be engraved on the wavelength conversion film, thereby forming perforations in the wavelength conversion film. However, a method of forming perforations is not limited thereto, and the perforations may be formed by various methods such as a method of irradiating a laser beam onto the surface of the wavelength conversion film.

As illustrated in FIG. 3, the perforations formed in the wavelength conversion film may have the form of slits 121 and holes 122. Specifically, the perforations may be disposed to divide the wavelength conversion film into areas for covering the individual light emitting devices 110. The perforations may be formed to be positioned between the light emitting devices 110 at the time of disposing the wavelength conversion layer 120 on the devices 110 in a subsequent process.

Each slit 121 may be formed in a region between two light emitting devices 110 that are adjacent to each other, and the hole 122 may be formed in a region in which four light emitting devices 110 are adjacent to each other. Sizes of the slit 121 and the hole 122 may be adjusted to allow the slit 121 and the hole 122 to be disposed between the individual light emitting devices 110 while allowing a liquid insulating material to be injected thereinto, whereby the insulating material may be easily injected in a subsequent process for forming an encapsulating part. In addition, multiple slits 121 and holes 122 may be provided in each region.

The use of perforations such as the slits 121 and the holes 122 may prevent the formation of voids in the encapsulating part in situations in which the liquid insulating material is not injected between the individual light emitting devices 110 during forming the encapsulating part after disposing the wavelength conversion layer 120. Specifically, the use of perforations may enable the liquid insulating material to penetrate through or be injected in the perforations in order to fill a space between the substrate, the light emitting devices, and the wavelength conversion layer so as to avoid the formation of voids in the space. Details thereof will be provided in a process of forming the encapsulating part.

The wavelength conversion layer 120 may be formed by cutting the wavelength conversion sheet having the perforations formed therein, and may be disposed on the at least two light emitting devices having the same (or substantially similar) color characteristic values.

Figure 4:
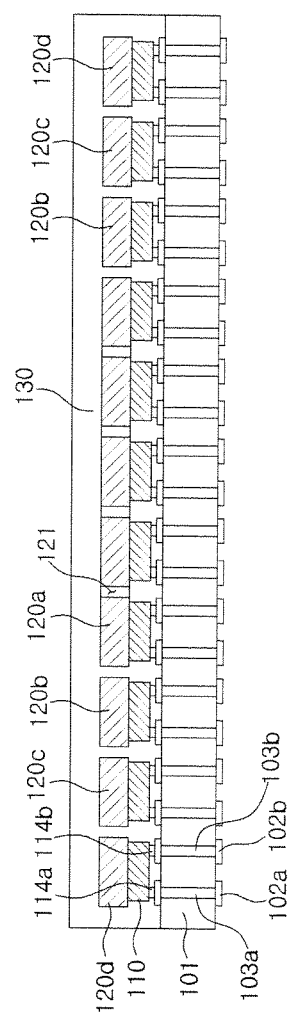

Next, as illustrated in FIG. 4, an encapsulating part 130 may be further formed to cover the wavelength conversion layer 120, thereby preventing contact with air and moisture. The encapsulating part 130 may be formed to enclose the light emitting devices 110 and the wavelength conversion layer 120. The encapsulating part 130 may enclose the light emitting devices 110 and the wavelength conversion layer 120, thereby protecting them from moisture and heat. The shape of the encapsulating part 130 may be adjusted to thereby control the distribution of light emitted from the light emitting devices 110.

The encapsulating part 130 may be formed of a light transmissive insulating material, and specifically, a liquid insulating resin that is light transmissive, such as a silicone resin, a modified silicone resin, an epoxy resin, a urethane resin, an oxetane resin, an acrylic resin, a polycarbonate resin, a polyimide resin, and a combination thereof. However, the material of the encapsulating part is not limited thereto, and an inorganic material having excellent light transmittance, such as glass, silica gel, or the like, may also be used therefor.

In a case in which the perforations are not formed in the wavelength conversion layer 120 at the time of forming the encapsulating part 130, the liquid insulating material may not be injected between the light emitting devices 110, resulting in the formation of voids. In a case in which the voids are formed between the light emitting devices 110, the rate of occurrence of packaging defects in a process of separating the light emitting devices 110 from one another may be increased, resulting in an increase in product defect rate. According to the present exemplary embodiment, the liquid insulating material may be injected through the slits 121 and the holes 122 in the wavelength conversion layer 120, thereby preventing voids from being formed between the light emitting devices 110. Thus, the product defect rate may be significantly lowered.

Figure 5:
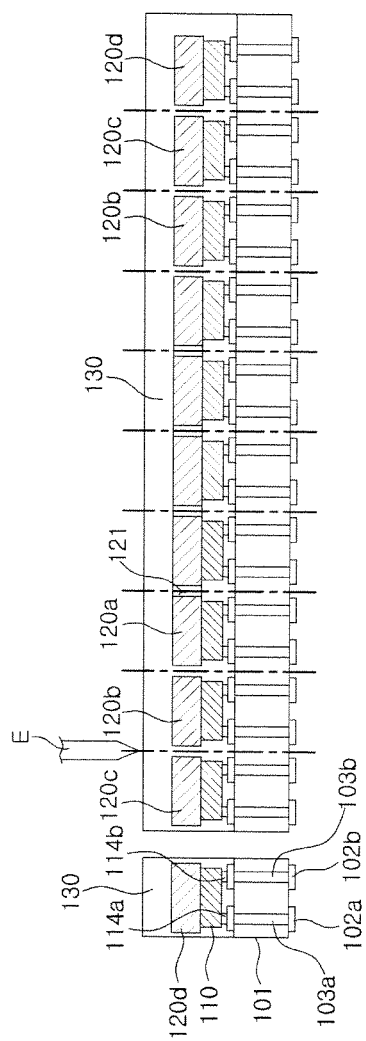

Next, as illustrated in FIG. 5, the encapsulating part 130 and the package substrate 101 may be cut and divided into individual light emitting device packages 100 using a blade E. However, a division method of the light emitting device packages 100 is not limited thereto, and a division method relying on irradiation of a laser beam or the like may be used.

Next, a method of manufacturing light emitting device packages according to an exemplary embodiment in the present disclosure will be described below. FIGS. 6 through 11 are schematic views illustrating a method of manufacturing light emitting device packages according to an exemplary embodiment in the present disclosure.

The present exemplary embodiment differs from the previous exemplary embodiment in that, after a wavelength conversion layer having a uniform thickness is formed on the entire surface of a package substrate on which light emitting devices are disposed, an additional wavelength conversion layer may be selectively formed according to the color characteristics of individual light emitting devices. The present exemplary embodiment will be described on the basis of this difference.

First, a plurality of light emitting devices 210 may be formed by growing a plurality of semiconductor layers on a wafer as in the previous exemplary embodiment. Next, the color characteristics of the plurality of light emitting devices 210 may be measured.

Figure 6:
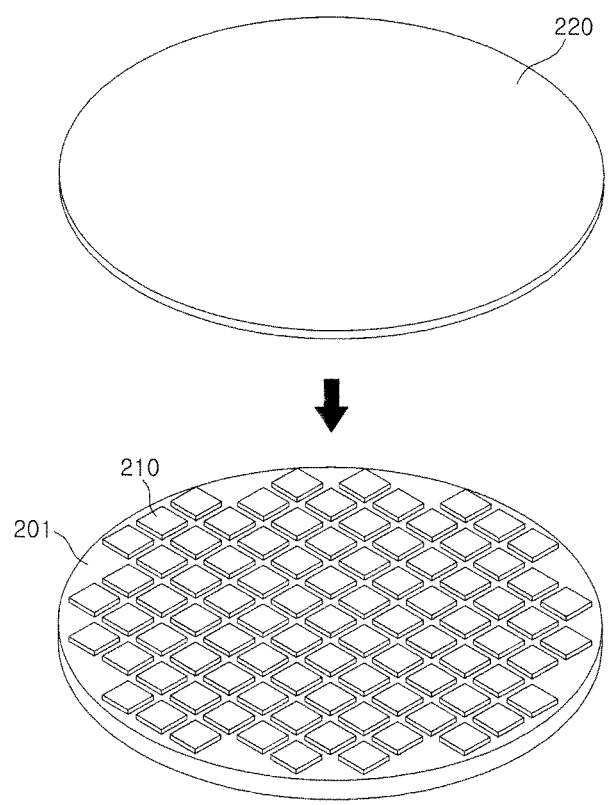
FIGS. 6 through 11 are schematic views illustrating processes for manufacturing light emitting device packages according to another exemplary embodiment in the present disclosure.

The plurality of light emitting devices 210 may be disposed above a package substrate 201 at predetermined intervals, as illustrated in FIG. 6.

The measured color characteristics may be at least one of wavelength (e.g., wavelength range and intensity spectrum), power, full width at half maximum (FWHM), and color coordinates of light emitted from the light emitting devices 210. According to the present exemplary embodiment, an average wavelength of light emitted from the light emitting devices 210 may be measured.

However, the measuring method is not limited thereto. Various methods for measuring the color characteristics, such as a method of irradiating ultraviolet light or a laser beam onto the surfaces of the light emitting devices 210 and measuring light reflected from the surfaces, may be used.

Then, as illustrated in FIG. 6, a wavelength conversion layer 220 may be formed to coverall the plurality of light emitting devices 210 as a whole.

This operation refers to forming the wavelength conversion layer 220 having a uniform thickness on all of the light emitting devices 210 mounted on the package substrate 201, instead of disposing different wavelength conversion layers 220 on individual light emitting devices 210 according to the color characteristics of the individual light emitting devices 210 as in the previous example described in relation to FIG. 3. The wavelength conversion layer 220 may be formed to have a uniform thickness. At this time, a type and an amount of a wavelength conversion material required for color compensation of the light emitting devices 110 may be determined based on a difference between the previously measured color characteristics and color characteristics targeted in the manufacturing process (hereinafter, referred to as the "target color characteristics"). In a case in which all of the plurality of light emitting devices 210 satisfy target color characteristics, it may be determined that the wavelength conversion layer 220 is formed in a standard amount for converting the light emitted from the light emitting devices 210 into white light. At this time, the wavelength conversion layer 220 may be formed to decrease the necessity of forming an additional wavelength conversion layer 240 for satisfying the target color characteristics in a subsequent process. Therefore, the wavelength conversion layer 220 can be formed by setting the color characteristic value in light of the lowest necessity of forming the additional wavelength conversion layer 240 as the standard amount, on the basis of the previously measured color characteristic values. For example, the color characteristic value of the wavelength conversion layer 220 may be set based on the measured color characteristic value of the light emitting device(s) 210 requiring the lowest level of adjustment in order to satisfy the target color characteristic. In this way, the time required for forming the additional wavelength conversion layer 240 may be reduced.

Next, a type and an amount of a wavelength conversion material required for color compensation of each light emitting device 210 may be determined based on a difference between the previously measured color characteristics and the target color characteristics. At this time, the type and the amount of the wavelength conversion material required may be determined in consideration of the previously formed wavelength conversion layer 220 (e.g., by adjusting the determined color compensation of each light emitting device 210 based on the previously formed wavelength conversion layer 220 covering the device 210).

Figure 7:
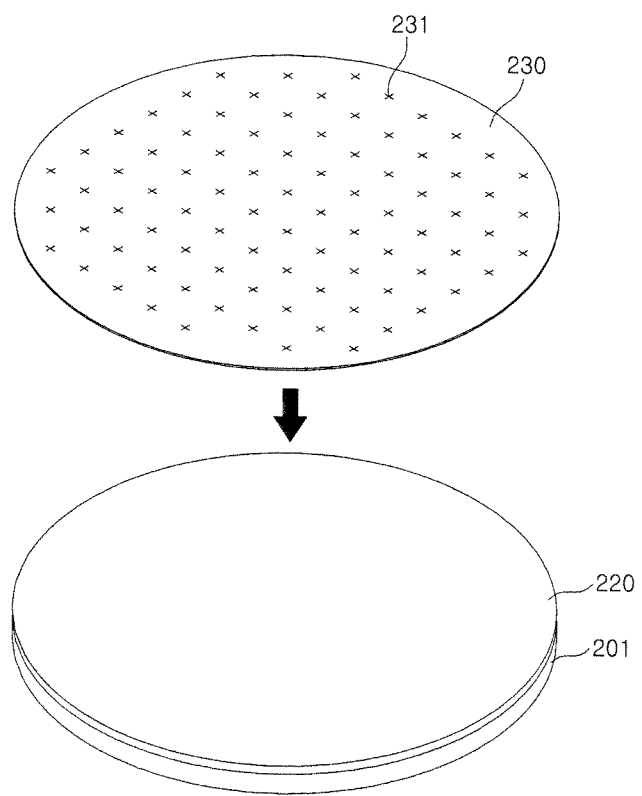

Next, as illustrated in FIG. 7, an align-key 230 used for disposing the additional wavelength conversion layer 240 in a subsequent process may be attached to the wavelength conversion layer 220. The align-key 230 may be a thin sheet of which one surface is provided with marks 231 (e.g., regularly disposed marks arrayed on the align-key 230), used as an array standard for selectively attaching the additional wavelength conversion layer 240 in a subsequent process. However, the attachment of the align-key is not essential, and may be omitted if the arrangement of the light emitting devices 210 positioned below the wavelength conversion layer 220 can be easily observed without the align-key, for example.

Figure 8:
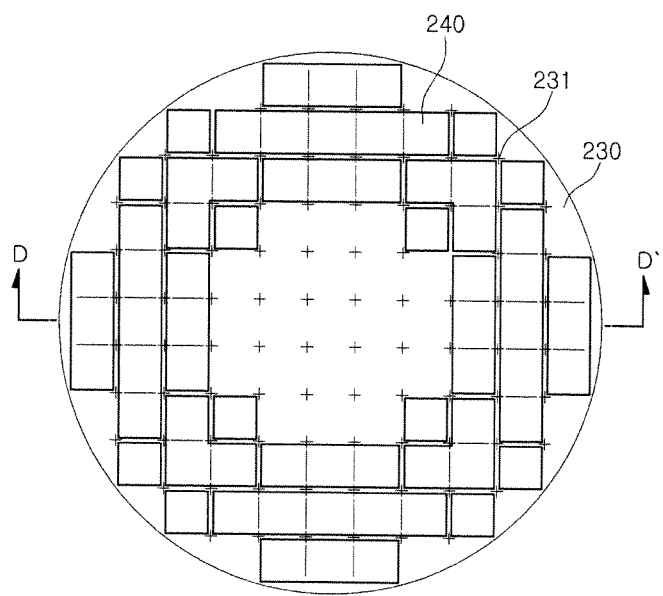

Next, as illustrated in FIG. 8, considering the type and the amount of the wavelength conversion material determined in the previous operation, the additional wavelength conversion layer 240 may be selectively formed on the wavelength conversion layer 220 in a position corresponding to at least a portion of the plurality of the light emitting devices 210.

At this time, the additional wavelength conversion layer 240 may be formed to cover at least two light emitting devices having the same color characteristic values among the plurality of light emitting devices 210 (e.g., two adjacent light emitting devices having the same color characteristic values), as in the previous exemplary embodiment, whereby the time required for disposing the additional wavelength conversion layer 240 may be shortened. The additional wavelength conversion layer 240 may further include a first region having a first type and a first amount of wavelength conversion material determined based on a measured color characteristic of one or more light emitting devices in one region of the substrate 201, and a second region having a second type and a second amount of wavelength conversion material (different from the first type and first amount) determined based on a measured color characteristic of one or more light emitting devices in another region of the substrate 201.

First and second bonding pads 202a and 202b may be formed on the package substrate 201, and the light emitting devices 210 may be mounted on the first and second bonding pads 202a and 202b. First and second electrodes 214a and 214b of the light emitting devices 210 may be electrically connected to the first and second bonding pads 202a and 202b using a conductive adhesive such as solder bumps or the like. The light emitting devices 210 may be mounted above one surface of the package substrate 201, and first and second through electrodes 203a and 203b may penetrate through the package substrate 201 from one surface of the package substrate 201 to the other surface thereof in a thickness direction. The first and second bonding pads 202a and 202b may be disposed on one surface and the other surface of the package substrate 201 (e.g., the opposing surface) to which the ends of the first and second through electrodes 203a and 203b are exposed, such that both surfaces of the package substrate 201 may be electrically connected to each other. The package substrate 201 may be a substrate for manufacturing wafer level packages (WLPs) in which packages are completely formed on the wafer level.

Figure 9:
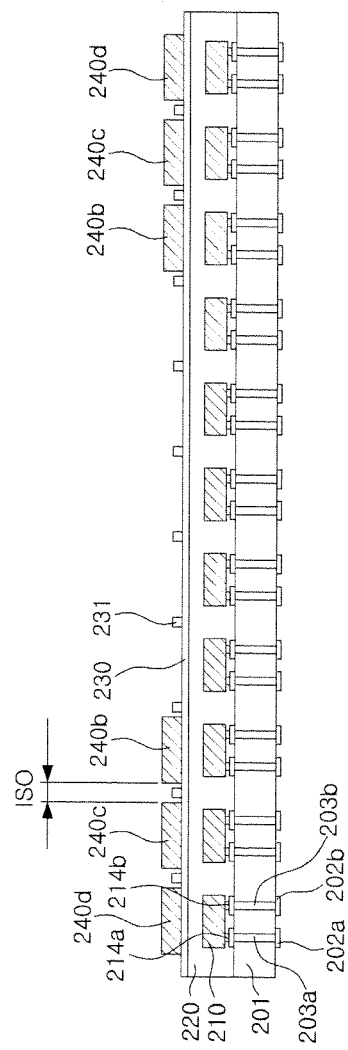

FIG. 9 is a side cross-sectional view taken along line D-D' of FIG. 8, and illustrates that the wavelength conversion layer 220 is formed on the light emitting devices 210 and the align-key 230 provided with the marks 231 is disposed thereon. In addition, the marks 231 may be disposed to correspond to and align with regions ISO between the plurality of light emitting devices 210, thereby marking positions for guiding the placement of additional wavelength conversion layers 240b, 240c, and 240d. As noted above, different light emitting devices 210 may have different wavelength conversion layers 240b, 240c, and 240d disposed thereon depending on the measured color characteristics of the different light emitting devices 210. In some embodiments, at least some of the light emitting devices 210 will not have any additional wavelength conversion layer formed thereon.

Figure 10:
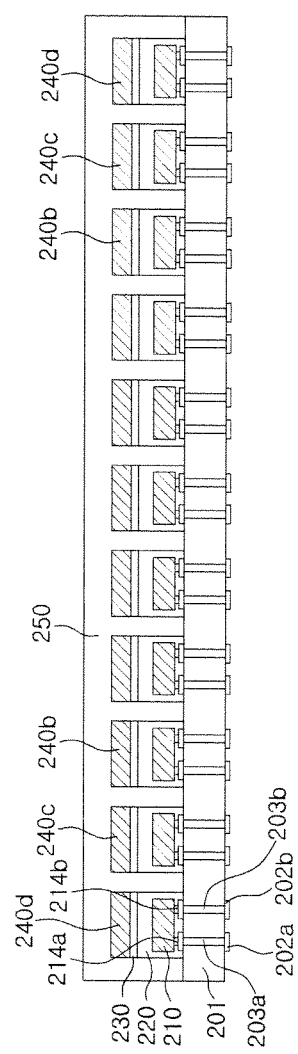

Next, as illustrated in FIG. 10, an encapsulating part 250 may be further formed to cover the wavelength conversion layer 220 and the additional wavelength conversion layer 240 (including wavelength conversion layers 240b, 240c, and 240d), thereby preventing air and moisture contact. Prior to the forming of the encapsulating part 250, the wavelength conversion layer 220 and the additional wavelength conversion layer 240 may be cut and divided into individual light emitting devices 210 with reference to the marks 231 of the align-key 230.

Figure 11:
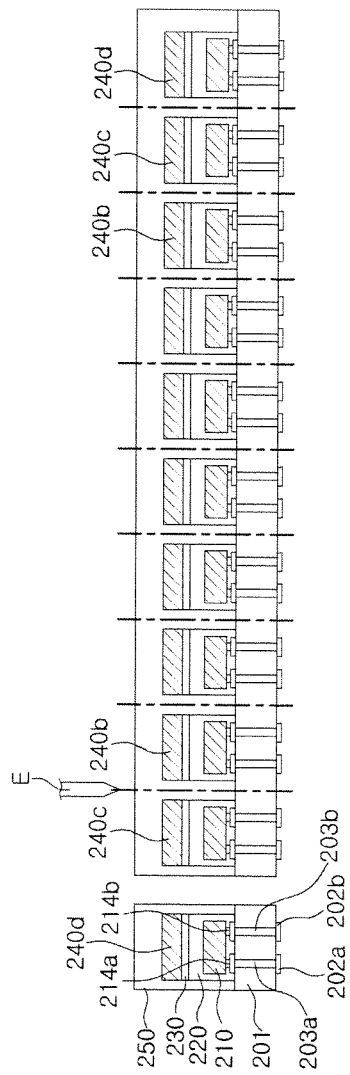

Next, as illustrated in FIG. 11, the encapsulating part 250 and the package substrate 201 may be cut and divided into individual light emitting device packages 200 using a blade E. However, a division method of the light emitting device packages 200 is not limited thereto, and a division method through irradiation of a laser beam or the like may be used.

The light emitting device packages according to exemplary embodiments in the present disclosure may be usefully applied to various products.

Figure 12:
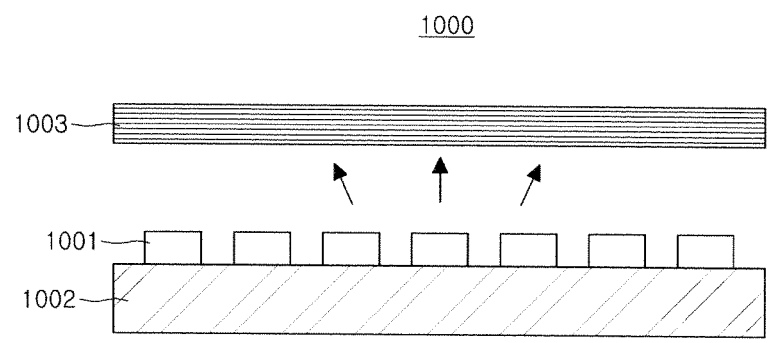
FIGS. 12 and 13 illustrate examples of a backlight unit to which a light emitting device package according to an exemplary embodiment in the present disclosure is applied.
Figure 13:
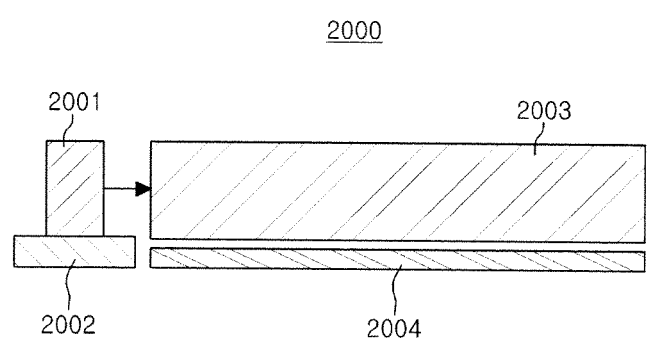

FIGS. 12 and 13 illustrate examples of a backlight unit to which a light emitting device package according to an exemplary embodiment in the present disclosure is applied.

With reference to FIG. 12, a backlight unit 1000 may include at least one light source 1001 mounted on a substrate 1002 and at least one optical sheet 1003 disposed thereabove. The light emitting device packages according to the above-described exemplary embodiments may be used as the light source 1001.

The light source 1001 in the backlight unit 1000 of FIG. 12 emits light toward a liquid crystal display (LCD) device disposed thereabove, whereas a light source 2001 mounted on a substrate 2002 in a backlight unit 2000 according to another embodiment illustrated in FIG. 13 emits light laterally, and the light is incident to a light guide plate 2003 such that the backlight unit 2000 may serve as a surface light source. The light travelling to the light guide plate 2003 may be emitted upwardly and a reflective layer 2004 may be disposed below a lower surface of the light guide plate 2003 in order to improve light extraction efficiency.

Figure 14:
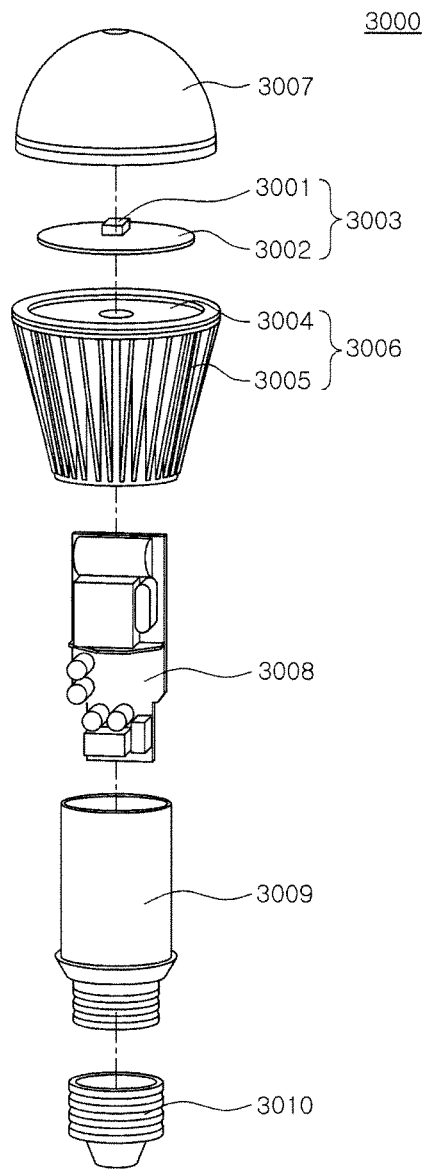
FIG. 14 illustrates an example of a lighting device to which a light emitting device package according to an exemplary embodiment in the present disclosure is applied.

FIG. 14 is an exploded perspective view illustrating an example of a lighting device to which a light emitting device package according to an exemplary embodiment in the present disclosure is applied.

A lighting device 3000 illustrated in FIG. 14 is a bulb-type lamp by way of example, and includes a light emitting module 3003, a driver 3008, and an external connector 3010.

In addition, the lighting device 3000 may further include exterior structures such as external and internal housings 3006 and 3009, a cover 3007, and the like. The light emitting module 3003 may include a light source 3001 and a circuit board 3002 on which the light source 3001 is mounted. The light emitting device packages according to the above-described exemplary embodiments may be used as the light source 3001. For example, the first and second electrodes of the above-described light emitting device package may be electrically connected to electrode patterns of the circuit board 3002. In the present exemplary embodiment, a single light source 3001 is mounted on the circuit board 3002 by way of example; however, a plurality of light sources may be mounted thereon as necessary.

The external housing 3006 may serve as a heat radiator and may include a heat sink plate 3004 directly contacting the light emitting module 3003 to thereby improve heat dissipation and heat radiating fins 3005 surrounding a lateral surface of the lighting device 3000 to further improve heat dissipation. The cover 3007 may be disposed above the light emitting module 3003 and have a convex lens shape. The driver 3008 may be disposed inside the internal housing 3009 and be connected to the external connector 3010 such as a socket structure to receive power from an external power source. In addition, the driver 3008 may convert the received power into power appropriate for driving the light source 3001 of the light emitting module 3003 and supply the converted power thereto. For example, the driver 3008 may be provided as an AC-DC converter, a rectifying circuit part, or the like.

Figure 15:
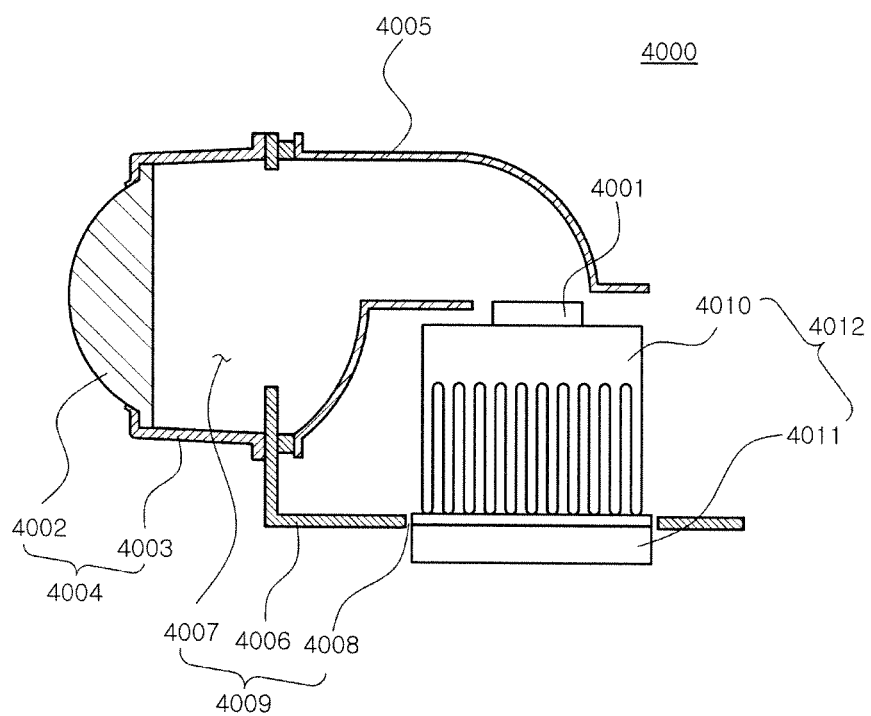
FIG. 15 illustrates an example of a headlamp to which alight emitting device package according to an exemplary embodiment in the present disclosure is applied.

FIG. 15 illustrates an example of a headlamp to which a light emitting device package according to an exemplary embodiment in the present disclosure is applied.

With reference to FIG. 15, a headlamp 4000 used in a vehicle or the like may include a light source 4001, a reflector 4005, and a lens cover 4004, and the lens cover 4004 may include a hollow guide part 4003 and a lens 4002. The light emitting device packages according to the above-described exemplary embodiments may be used as the light source 4001.

The headlamp 4000 may further include a heat radiator 4012 dissipating heat generated by the light source 4001 outwardly. The heat radiator 4012 may include a heat sink 4010 and a cooling fan 4011 in order to effectively dissipate heat. In addition, the headlamp 4000 may further include a housing 4009 allowing the heat radiator 4012 and the reflector 4005 to be fixed thereto and supported thereby. The housing 4009 may include a body 4006 and a central hole 4008 formed in one surface thereof, to which the heat radiator 4012 is coupled.

The housing 4009 may include a forwardly open hole 4007 formed in the other surface thereof integrally connected to one surface thereof and bent in a direction perpendicular thereto. The reflector 4005 may be fixed to the housing 4009, such that light generated by the light source 4001 may be reflected by the reflector 4005, pass through the forwardly open hole 4007, and be emitted outwardly.

As set forth above, in a method of manufacturing light emitting device packages according to exemplary embodiments in the present disclosure, time required for forming a wavelength conversion layer is shortened, whereby manufacturing time of light emitting device packages may be reduced.

While exemplary embodiments have been shown and described above, it will be apparent to those skilled in the art that modifications and variations could be made without departing from the scope of the invention as defined by the appended claims.

What is claimed is:

1. A method of manufacturing a light emitting device package, the method comprising:
    forming a plurality of light emitting devices by growing a plurality of semiconductor layers on a wafer;
    measuring color characteristics of light emitted from each of the plurality of light emitting devices;
    determining, for each of the plurality of light emitting devices, a type and an amount of wavelength conversion material for color compensating the light emitting device based on a difference between the measured color characteristics and target color characteristics;
    forming, on at least two light emitting devices among the plurality of light emitting devices, a wavelength conversion layer having the type and the amount of wavelength conversion material determined for the at least two light emitting devices; and
    dividing the plurality of light emitting devices into individual light emitting device packages,
    wherein the forming of the wavelength conversion layer comprises:
    preparing a wavelength conversion film having the type and the amount of the wavelength conversion material determined for the at least two light emitting devices;
    cutting the wavelength conversion film to have an area sufficient to cover the at least two light emitting devices; and
    disposing the cut wavelength conversion film on the at least two light emitting devices.

2. The method of claim 1, wherein the wavelength conversion film is divided into a plurality of regions.

3. The method of claim 2, wherein areas of the plurality of regions correspond to areas of the individual light emitting devices.

4. The method of claim 2, wherein perforations are formed in the wavelength conversion film between the plurality of regions.

5. The method of claim 4, wherein the perforations are slits.

6. The method of claim 1, further comprising:
    cutting the plurality of light emitting devices into individual light emitting devices and mounting the plurality of light emitting devices on a package substrate, prior to forming the wavelength conversion layer,
    wherein the dividing into the individual light emitting device packages includes dicing the package substrate.

7. The method of claim 1, further comprising:
    forming a light transmissive encapsulating part on the plurality of light emitting devices on which the wavelength conversion layer has been formed, prior to dividing the plurality of light emitting devices into the individual light emitting device packages.

8. The method of claim 7,
    wherein the forming of the wavelength conversion layer comprises disposing on at least two light emitting devices a wavelength conversion film having the type and the amount of the wavelength conversion material determined for the at least two light emitting devices,
    wherein perforations are formed in the wavelength conversion film, and
    wherein the forming of the encapsulating part comprises injecting an insulating material for the encapsulating part into the perforations.

9. The method of claim 1, wherein the wavelength conversion film is formed of a semi-cured material containing a phosphor.

10. The method of claim 1, wherein the measured color characteristics of light emitted from each of the plurality of light emitting devices include at least one of wavelength, power, full width at half maximum (FWHM), and color coordinates of light emitted from each of the plurality of light emitting devices.

11. The method of claim 1, wherein the wavelength conversion film has a structure in which a plurality of layers is stacked.

12. The method of claim 11, wherein different layers of the plurality of layers in the wavelength conversion film include different phosphors.

13. The method of claim 1, further comprising:
forming a wavelength conversion cover layer having a uniform thickness to cover all of the plurality of light emitting devices.

14. A method comprising:
measuring, for each of a plurality of light emitting devices mounted on a substrate, color characteristics of light emitted from the light emitting device;
identifying, among the plurality of light emitting devices, a group of adjacent light emitting devices having similar measured color characteristics;
determining, for the group of adjacent light emitting devices, a type and an amount of wavelength conversion material for color compensating the light emitting devices based on a difference between the measured color characteristics and target color characteristics; and
disposing, across the group of adjacent light emitting devices, a wavelength conversion film having the type and the amount of wavelength conversion material determined for the group of light emitting devices,
wherein the wavelength conversion film spans across regions of the substrate between the adjacent light emitting devices, and
wherein the wavelength conversion film includes perforations formed in the wavelength conversion film in the regions spanning between the adjacent light emitting devices.

15. The method of claim 14, further comprising:
forming a light transmissive encapsulating part on the plurality of light emitting devices,
wherein the forming of the light transmissive encapsulating part includes injecting an insulating material for the encapsulating part into the perforations.

16. The method of claim 14,
wherein the identifying comprises identifying a first region of the substrate having a first group of adjacent light emitting devices disposed thereon having similar first measured color characteristics, and a second region of the substrate having a second group of adjacent light emitting devices disposed thereon having similar second measured color characteristics different from the first measured color characteristics,
wherein the determining comprises determining first and second types and first and second amounts of wavelength conversion material for color compensating the light emitting devices of the first and second groups, respectively, based on differences between the measured color characteristics and target color characteristics, and
wherein the disposing comprises disposing, across the first region of the substrate having the first group of adjacent light emitting devices disposed thereon, a first wavelength conversion film having the first type and the first amount of wavelength conversion material determined for the first group of light emitting devices, and disposing, across the second region of the substrate having the second group of adjacent light emitting devices disposed thereon, a second wavelength conversion film having the second type and the second amount of wavelength conversion material determined for the second group of light emitting devices.

17. The method of claim 16, further comprising:
forming a light transmissive encapsulating part on the plurality of light emitting devices and in regions between the light emitting devices of the first and second groups.

* * * * *